United States Patent
Liu

(10) Patent No.: US 9,756,743 B2
(45) Date of Patent: Sep. 5, 2017

(54) LOCK MECHANISM ADAPTED TO AN ELECTRONIC DEVICE AND ELECTRONIC DEVICE THEREWITH

(71) Applicant: Wistron Corporation, New Taipei (TW)

(72) Inventor: Yuangqing Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 549 days.

(21) Appl. No.: 13/784,840

(22) Filed: Mar. 5, 2013

(65) Prior Publication Data
US 2013/0278119 A1    Oct. 24, 2013

(30) Foreign Application Priority Data

Apr. 20, 2012  (CN) .......................... 2012 1 0119167

(51) Int. Cl.
*H05K 5/02*    (2006.01)
(52) U.S. Cl.
CPC .................................. *H05K 5/0208* (2013.01)
(58) Field of Classification Search
CPC .................................................... H05K 5/0208
See application file for complete search history.

(56) References Cited

U.S. PATENT DOCUMENTS

| | | | |
|---|---|---|---|
| 6,575,503 B1* | 6/2003 | Johansson et al. | ........... 292/170 |
| 7,986,524 B2* | 7/2011 | Dong | ............... G06F 1/1626 |
| | | | 312/223.1 |
| 9,036,335 B2* | 5/2015 | Liang | ................ H05K 5/0221 |
| | | | 361/679.01 |
| 2007/0001559 A1* | 1/2007 | Chen | ....................... E05C 1/14 |
| | | | 312/223.2 |

* cited by examiner

*Primary Examiner* — Kristina Fulton
*Assistant Examiner* — Thomas Neubauer
(74) *Attorney, Agent, or Firm* — Winston Hsu

(57) ABSTRACT

A lock mechanism adapted to an electronic device with a base, a first casing and a second casing includes a sliding member, a push button, a latch member, a first guiding structure and a second guiding structure. The sliding member is disposed on the base in a slidable manner. The push button is combined with the sliding member for driving the sliding member to slide relative to the base. The latch member is disposed on the base in a slidable manner. The first guiding structure is disposed on the sliding member. The second guiding structure is disposed on the latch member. The second guiding structure cooperates with the first guiding structure for sliding relative to the first guiding structure when the sliding member slides relative to the base, so as to guide the latch member to a locking position for locking the first casing and the second casing.

18 Claims, 11 Drawing Sheets

LOCK MECHANISM ADAPTED TO AN ELECTRONIC DEVICE AND ELECTRONIC DEVICE THEREWITH

BACKGROUND OF THE INVENTION

1. Field of the Invention

The present invention relates to a lock mechanism, and more particularly, to a lock mechanism for simultaneously locking two different casings of an electronic device and an electronic device therewith.

2. Description of the Prior Art

A cashier is used for storing money for merchandise exchange in a shopping mall or in a local store in daily life. Thus, the cashier has a money box for storing the money and a casing for covering internal components of the cashier. The money box is retractably installed on the casing. When the merchandise is exchanged, the money box is pulled out of the casing for the money exchange. When the merchandise exchange is done, the money box is pushed into the casing for protecting the money stored inside the money box.

Since there are large amounts of money stored in the cashier, two lock mechanisms are often used for preventing the money in the cashier from theft. One of the two lock mechanisms locks the money box and the casing for preventing the money box from being pulled out of the casing. The other one of the two lock mechanisms locks the cashier onto a fixing object, such as a ground, for preventing the cashier from being moved to other places. However, the conventional design by utilizing the two lock mechanisms results in high costs and complication of dual locking operation.

SUMMARY OF THE INVENTION

Thus, the present invention provides a lock mechanism for simultaneously locking two different casings of an electronic device and an electronic device therewith for solving above drawbacks.

According to an embodiment of the present invention, a lock mechanism adapted to an electronic device is disclosed. The electronic device includes a base, a first casing and a second casing. The first casing and the second casing are installed on the base. The lock mechanism includes a sliding member, a push button, a latch member, a first guiding structure and a second guiding structure. The sliding member is disposed on the base in a slidable manner. The push button is combined with the sliding member for driving the sliding member to slide relative to the base. The latch member is disposed on the base in a slidable manner. The first guiding structure is disposed on the sliding member. The second guiding structure is disposed on the latch member. The second guiding structure cooperates with the first guiding structure for sliding relative to the first guiding structure when the sliding member slides relative to the base, so as to guide the latch member to a locking position for locking the first casing and the second casing.

According to another embodiment of the present invention, the first casing is installed on the base along a first direction, and the second casing is installed on the base along a second direction opposite to the first direction. The base includes a guiding structure, and the sliding member includes a sliding structure. The guiding structure is for cooperating with the sliding structure, so as to slide the sliding member relative to the base along the first direction or along the second direction.

According to another embodiment of the present invention, the guiding structure includes a first guiding member and a second guiding member. The sliding structure includes a first slot structure and a second slot structure. The first slot structure is for cooperating with the first guiding member. The second slot structure is for cooperating with the second guiding member. The second slot structure and the first slot structure are cooperatively for constraining the sliding member to slide along the first direction or along the second direction and for preventing the sliding member from rotating about the base when the sliding member slides relative to the base.

According to another embodiment of the present invention, the first guiding structure and the second guiding structure guide the latch member to slide relative to the base to the locking position along a third direction when the sliding member slides along the first direction. The first guiding structure and the second guiding structure guide the latch member to slide relative to the base to a release position along a fourth direction opposite to the third direction when the sliding member slides along the second direction.

According to another embodiment of the present invention, at least one through hole is formed on the base, and a wedging slot is formed on the first casing. The second casing includes a stopping structure, and the latch member includes a latch body, at least one constraining post, a wedging pin and a stopping portion. The second guiding structure is formed on the latch body. The at least one constraining post protrudes from the latch body and is slidably disposed through the at least one through hole, so as to constrain the latch body to slide relative to the base along the third direction or along the fourth direction. The wedging pin, protruding from the latch body, wedges with the wedging slot when the latch body slides to the locking position along the third direction, so as to prevent the first casing from separating from the base along the second direction. The stopping portion is disposed on the latch body for abutting against the stopping structure when the latch body slides to the locking position along the third direction, so as to prevent the second casing from separating from the base along the first direction.

According to another embodiment of the present invention, the first guiding structure is a guide pin, the second guiding structure is a guiding slot and includes a first guiding slot portion, a second guiding slot portion and a third slot portion. A distance between the second guiding slot portion and the wedging pin is greater than a distance between the first guiding slot portion and the wedging pin. The third slot portion is connected to the first guiding slot portion and the second guiding slot portion. The latch body is guided to the locking position along the third direction when the guide pin moves from the first guiding slot portion to the second guiding slot portion via the third guiding slot portion along the first direction. The latch body is guided to the release position along the fourth direction when the guide pin moves from the second guiding slot portion to the first guiding slot portion via the third guiding slot portion along the second direction.

According to another embodiment of the present invention, the first direction or the second direction is substantially perpendicular to the third direction or the fourth direction.

According to another embodiment of the present invention, the lock mechanism further includes a locking member.

The locking member is combined and slidable with the sliding member for locking the sliding member in the locking position.

According to another embodiment of the present invention, the push button includes a locking portion for locking with a lock device, so as to fix the push button on the base.

According to another embodiment of the present invention, the sliding member and the push button are integrally formed.

According to another embodiment of the present invention, an electronic device includes a base, a first casing, a second casing and a lock mechanism. The first casing is installed on the base, and the second casing is installed on the base. The lock mechanism includes a sliding member, a push button, a latch member, a first guiding structure and a second guiding structure. The sliding member is disposed on the base in a slidable manner. The push button is combined with the sliding member for driving the sliding member to slide relative to the base. The latch member is disposed on the base in a slidable manner. The first guiding structure is disposed on the sliding member. The second guiding structure is disposed on the latch member. The second guiding structure cooperates with the first guiding structure for sliding relative to the first guiding structure when the sliding member slides relative to the base, so as to guide the latch member to a locking position for locking the first casing and the second casing.

In summary, the present invention utilizes the wedging pin of the latch member to engage with the wedging slot on the first casing for preventing the first casing from separating from the base along the second direction, so as to fix the first casing on the base. The present invention further utilizes the stopping portion of the latch member to abut against the stopping structure of the second casing for preventing the second casing from separating from the base along the first direction, so as to fix the second casing on the base. In other words, the present invention utilizes the latch member to simultaneously lock the first casing and the second casing on the base, i.e. the present invention utilizes a single lock device to cooperate with a locking member or with the locking portion of the push button for fixing the latch member in the locking position, so as to fix the first casing and the second casing on the base.

In summary, the present invention is capable of simultaneously locking the first casing and the second casing by the single one lock device. Accordingly, it can save costs of the lock device, and the locking operation of the single one lock device can be done by a single operation without an extra operation. As a result, it can reduce complication of the operation and greatly enhance convenience in use.

These and other objectives of the present invention will no doubt become obvious to those of ordinary skill in the art after reading the following detailed description of the embodiment that is illustrated in the various figures and drawings.

DETAILED DESCRIPTION

Figure 1:
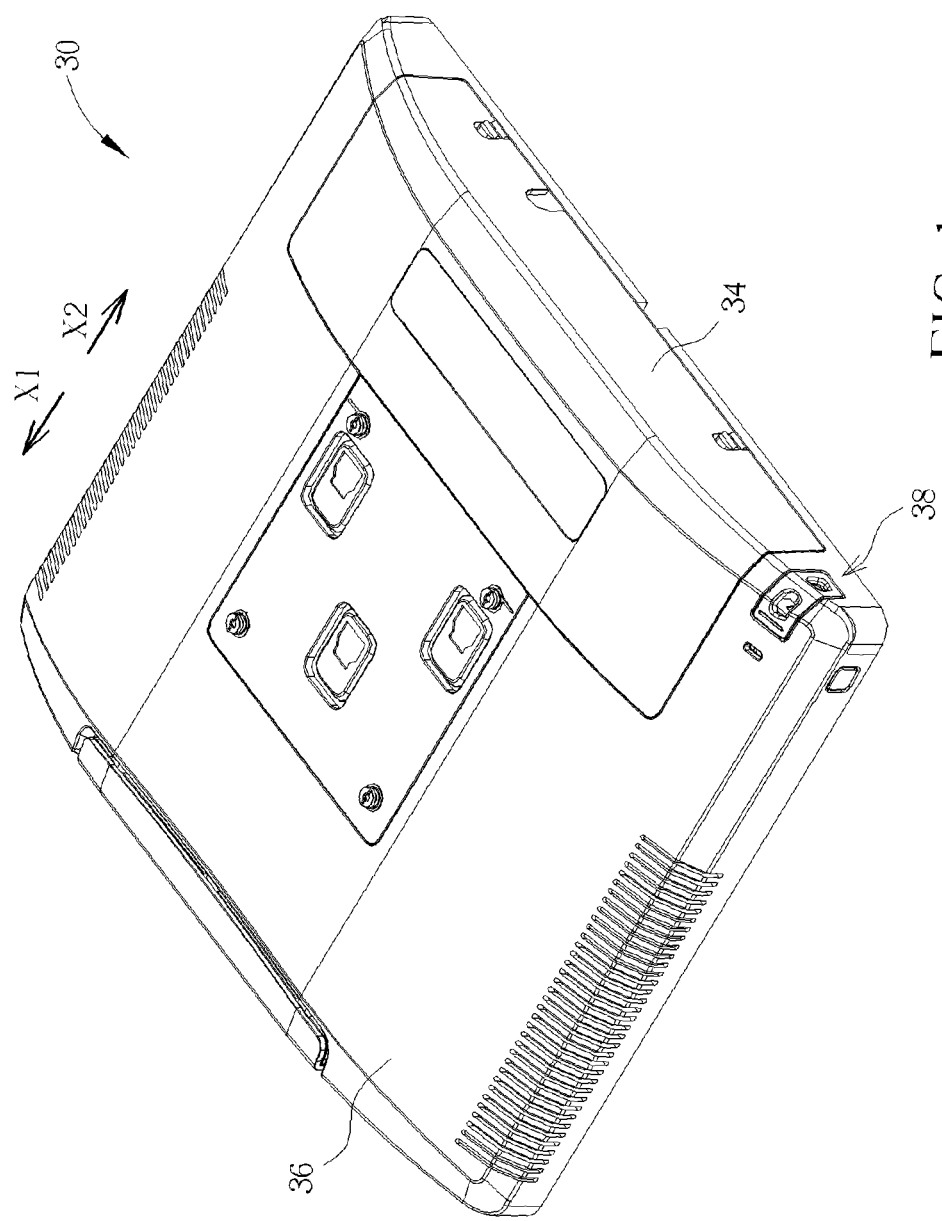
FIG. 1 is a schematic diagram of an electronic device according to an embodiment of the present invention.
Figure 2:
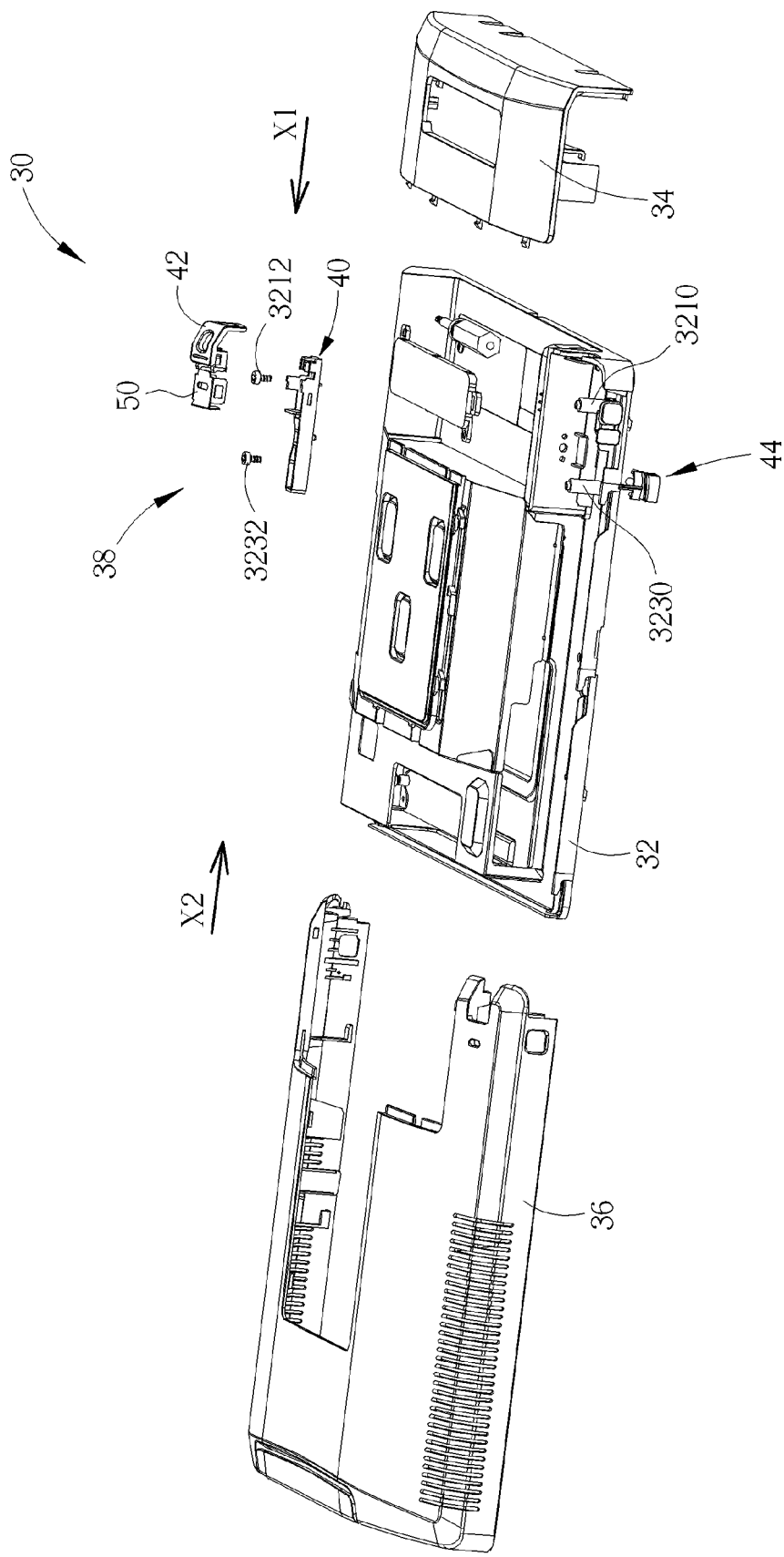
FIG. 2 is an exploded diagram of the electronic device according to the embodiment of the present invention.

Please refer to FIG. 1 and FIG. 2. FIG. 1 is a schematic diagram of an electronic device 30 according to an embodiment of the present invention. FIG. 2 is an exploded diagram of the electronic device 30 according to the embodiment of the present invention. As shown in FIG. 1 and FIG. 2, the electronic device 30 includes a base 32, a first casing 34 and a second casing 36. The first casing 34 is installed on the base 32 along a first direction X1, and the second casing 36 is installed on the base 32 along a second direction X2 opposite to the first direction X1. When the first casing 34 and the second casing 36 are installed on the base 32, a containing space is formed between the first casing 34 and the base 32 for storing objects, such as an electronic storage device, e.g. a hard disk drive, for storing records of consumption by credit card, personal account data, expenditure records and so on. Additionally, another containing space is formed between the second casing 36 and the base 32 for containing internal electronic components of the electronic device 30, so as to prevent the internal electronic components of the electronic device 30 from damage due to collision. The implementation of the containing space and the other containing space are not limited to those mentioned above, and it depends on practical demands.

In this embodiment, the electronic device 30 can be, but not limited to, a cashier. For example, the electronic device 30 can be other electronic products, such as a tablet computer, an electronic book and so on. Additionally, the electronic device 30 further includes a lock mechanism 38 for locking the first casing 34 and the second casing 36, so as to prevent the first casing 34 and the second casing 36 from separating from the base 32 along the second direction X2 and along the first direction X1, respectively.

Figure 3:
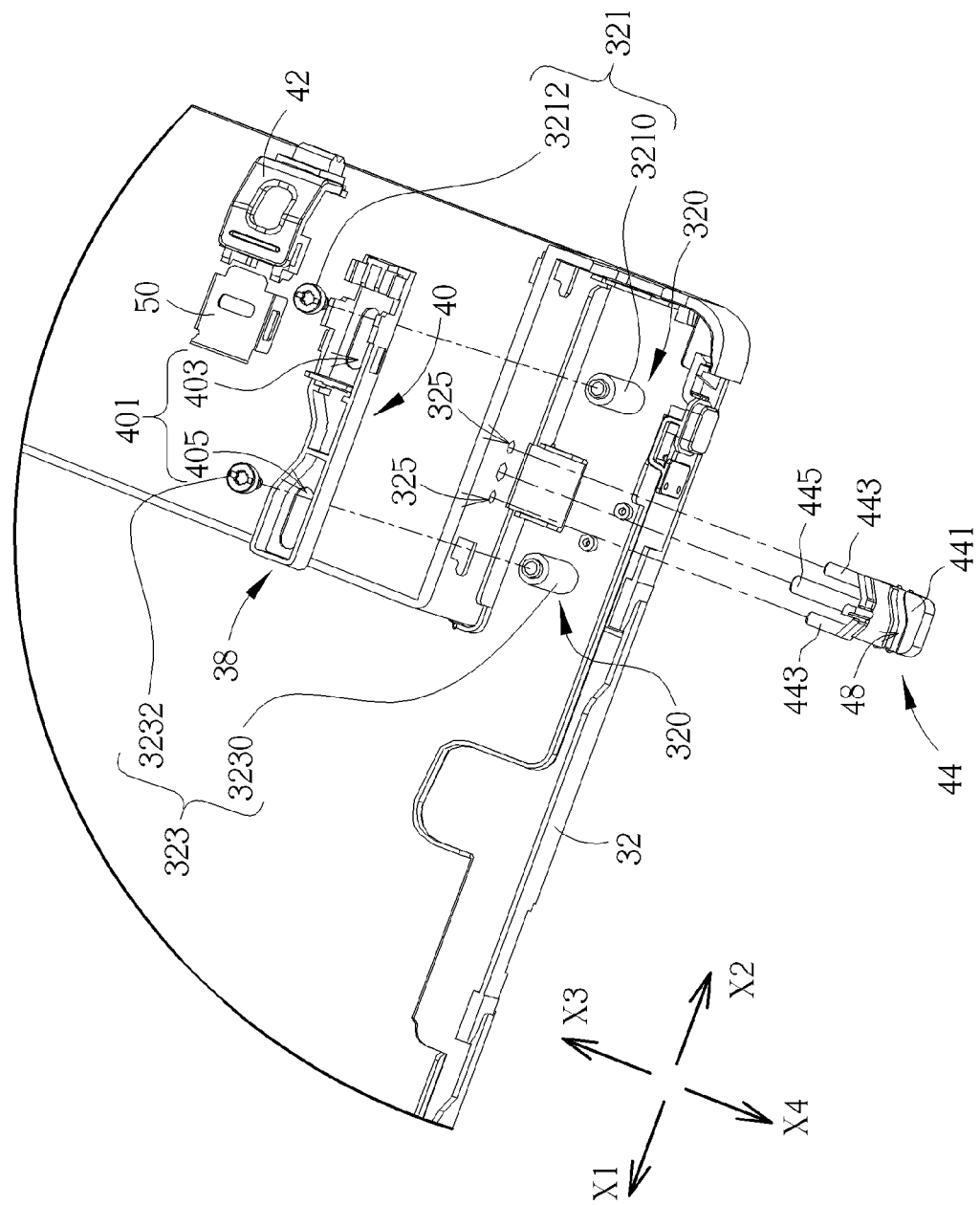
FIG. 3 is a partially exploded diagram of a base and a lock mechanism according to the embodiment of the present invention.

Please refer to FIG. 3. FIG. 3 is a partially exploded diagram of the base 32 and the lock mechanism 38 according to the embodiment of the present invention. As shown in FIG. 3, the lock mechanism 38 includes a sliding member 40 and a push button 42. The push button 42 is combined with the sliding member 40 for providing a place where force can be applied, such that the push button 42 can be pushed to drive the sliding member 40 to slide relative to the base 32. In such a manner, the sliding member 40 can be disposed on the base 32 in a slidable manner. In this embodiment, the sliding member 40 and the push button 42 can be, but not limited to, two separate components. For example, the sliding member 40 and the push button 42 can be integrally formed as well for saving tooling costs and further for saving manufacture costs. As for which one of the above-mentioned designs is adopted, it depends on practical demands.

Furthermore, the base 32 includes a guiding structure 320, and the sliding member 40 includes a sliding structure 401. The guiding structure 320 is used for cooperating with the sliding structure 401, so as to slide the sliding member 40 relative to the base 32 along the first direction X1 or along the second direction X2. In this embodiment, the guiding structure 320 includes a first guiding member 321 and a second guiding member 323, and the sliding structure 401 includes a first slot structure 403 and a second slot structure 405. The first slot structure 403 and the second slot structure 405 respectively correspond to the first guiding member 321 and the second guiding member 323 and respectively cooperate with the first guiding member 321 and the second guiding member 323. Accordingly, the sliding member 40 can be disposed on the base 32 in a slidable manner.

Figure 4:
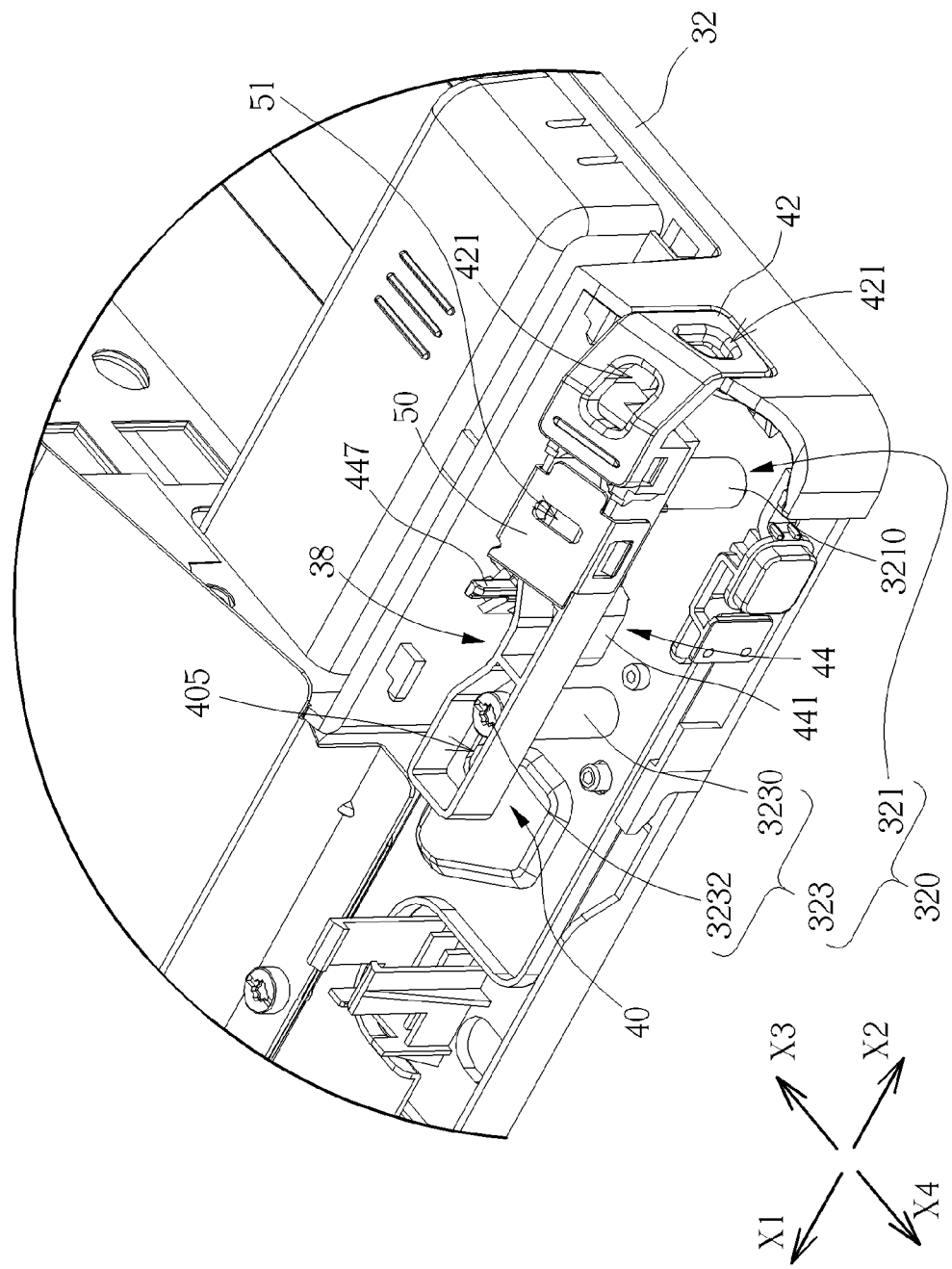
FIG. 4 is an assembly diagram of the base and the lock mechanism according to the embodiment of the present invention.

Please refer to FIG. 3 and FIG. 4. FIG. 4 is an assembly diagram of the base 32 and the lock mechanism 38 according to the embodiment of the present invention. As shown in FIG. 3 and FIG. 4, since orientations of the first slot structure 403 and the second slot structure 405 of the sliding structure 401 are substantially parallel to the first direction X1 and the second direction X2, the first slot structure 403 and the second slot structure 405 can constrain sliding direction of the sliding member 40 when the push button 42 is pushed to drive the sliding member 40 to slide relative to the base 32. In other words, when the sliding member 40 slides relative to the base 32, the first slot structure 403 and the second slot structure 405 can constrain the sliding member 40 to slide relative to the base 32 along the first direction X1 or along the second direction X2.

In addition, the first slot structure 403 and the second slot structure 405 can further prevent the sliding member 40 from rotating about the first guiding member 321 and the second guiding member 323. When the sliding member 40 is desired to rotate about the first guiding member 321, the second slot structure 405 and the second guiding member 323 can provide a reverse torque for preventing the sliding member 40 from rotating about the first guiding member 321. When the sliding member 40 is desired to rotate about the second guiding member 323, the first slot structure 403 and the first guiding member 321 can provide another reverse torque for preventing the sliding member 40 from rotating about the second guiding member 323. In other words, when the sliding member 40 slides relative to the base 32, the first slot structure 403 and the second slot structure 405 of the sliding structure 401 can further prevent the sliding member 40 from rotating about the base 32.

In this embodiment, the first guiding member 321 includes a first screw post 3210 and a first screw component 3212, and the second guiding member 323 includes a second screw post 3230 and a second screw component 3232. When the sliding member 40 and the base 32 are installed, the sliding member 40 is installed onto the first screw post 3210 of the first guiding member 321 and the second screw post 3230 of the second guiding member 323 first. Afterwards, the first screw component 3212 and the second screw component 3232 are respectively disposed through the first slot structure 403 and the second slot structure 405. Finally, the first screw component 3212 and the second screw component 3232 are screwed onto the first screw post 3210 and the second screw post 3230.

In such a manner, when the sliding member 40 slides relative to the base 32, the first screw component 3212 and the second screw component 3232 can prevent the sliding member 40 from separating from the first screw post 3210 and the second screw post 3230 upwards. Accordingly, the sliding member 40 can stably slide relative to the base 32. As shown in FIG. 2 and FIG. 4, the lock mechanism 38 further includes a latch member 44 for latching the first casing 34 and the second casing 36, so as to prevent the first casing 34 and the second casing 36 from separating from the base 32 along the first direction X1 or along the second direction X2, respectively.

It should be noticed that the structures of the guiding structure 320 and the sliding structure 401 are not limited to those mentioned in this embodiment. For example, the guiding structure 320 and the sliding structure 401 can be a combination of sliding slot and sliding rack. In other words, the structures of the guiding structure 320 and the sliding structure 401 for sliding the sliding member 40 relative to the base 32 along the first direction X1 or along the second direction X2 are within the scope of the present invention.

As shown in FIG. 3, two through holes 325 are formed on the base 32, and the latch member 44 includes a latch body 441 and two constraining posts 443. The two constraining posts 443 protrude from the latch body 441 and are slidably disposed through the through holes 325. As a result, the latch body 441 of the latch member 44 can be disposed on the base 32 in a slidable manner by cooperation of the through holes 325 and the constraining posts 443. Additionally, since the opening orientations of the through holes 325 are substantially parallel to a third direction X3 and a fourth direction X4 opposite to the third direction X3, the latch body 441 of the latch member 44 can be constrained to slide relative to the base 32 along the third direction X3 or along the fourth direction X4 by the through holes 325.

In this embodiment, the first direction X1 or the second direction X2 can be, but not limited to, substantially perpendicular to the third direction X3 or the fourth direction X4. For example, an angle included between the first direction X1 and the third direction X3 or the fourth direction X4 can be greater than or smaller than 90 degrees, and an angle included between the second direction X2 and the third direction X3 or the fourth direction X4 can be greater than or smaller than 90 degrees. As for which one of the above-mentioned designs is adopted, it depends on practical demands. Amounts of the through hole and the constraining post are not limited to those mentioned in this embodiment. For example, there can be one single through hole 325 formed on the base 32 as well, and thus the latch member 44 can include one constraining posts 443 for corresponding to the amount of the through hole 325. In other words, the structures of the base 32 with at least one through hole 325 and the latch member 44 with at least one constraining post 443 are within the scope of the present invention.

Figure 5:
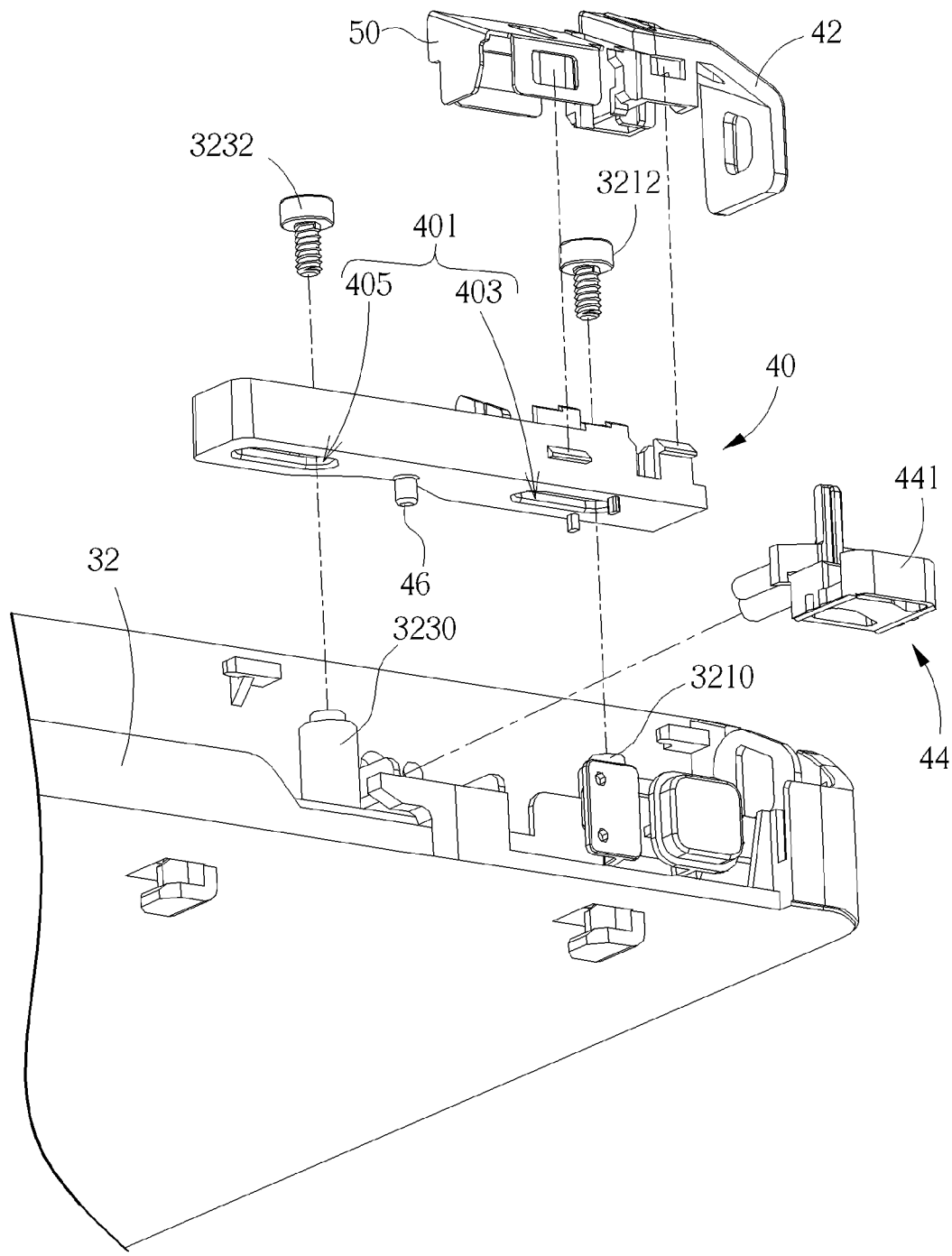
FIG. 5 is a partially exploded diagram of the base and the lock mechanism according to the embodiment of the present invention.

Please refer to FIG. 3 to FIG. 5. FIG. 5 is a partially exploded diagram of the base 32 and the lock mechanism 38 according to the embodiment of the present invention. As shown in FIG. 3 to FIG. 5, the lock mechanism 38 further includes a first guiding structure 46 and a second guiding structure 48. The first guiding structure 46 is disposed on the sliding member 40, and the second guiding structure 48 is disposed on the latch body 441 of the latch member 44 for cooperating with the first guiding structure 46. When the sliding member 40 slides relative to the base 32, the first guiding structure 46 on the sliding member 40 can move relative to the second guiding structure 48 on the latch member 44, so as to drive the latch body 441 of the latch member 44 to slide relative to the base 32. In this embodiment, the first guiding structure 46 can be a guide pin, and the second guiding structure 48 can be a guide slot. Accordingly, the guide slot can be used for cooperating with the guide pin, so as to slide the latch body 441 of the latch member 44 relative to the base 32.

Figure 6:
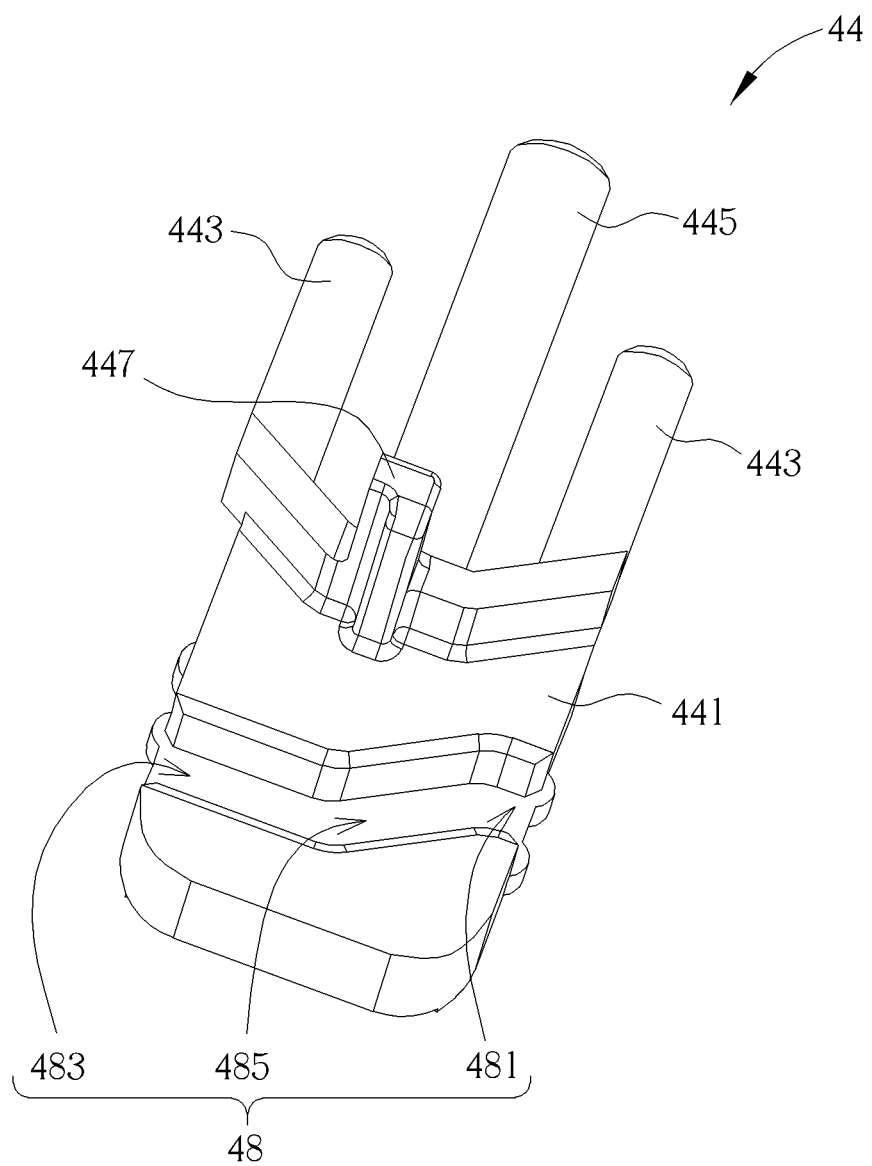
FIG. 6 is a diagram of a latch member according to the embodiment of the present invention.

Please refer to FIG. 6. FIG. 6 is a diagram of the latch member 44 according to the embodiment of the present invention. As shown in FIG. 6, the latch member 44 further includes a wedging pin 445 protruding from the latch body 441. In addition, the second guiding structure 48 includes a first guiding slot portion 481, a second guiding slot portion 483, a third guiding slot portion 485. A distance between the second guiding slot portion 483 of the second guiding structure 48 and the wedging pin 445 of the latch member 44 is greater than a distance between the first guiding slot portion 481 of the second guiding structure 48 and the wedging pin 445 of the latch member 44, and the third guiding slot portion 485 is connected to the first guiding slot portion 481 and the second guiding slot portion 483.

Figure 7:
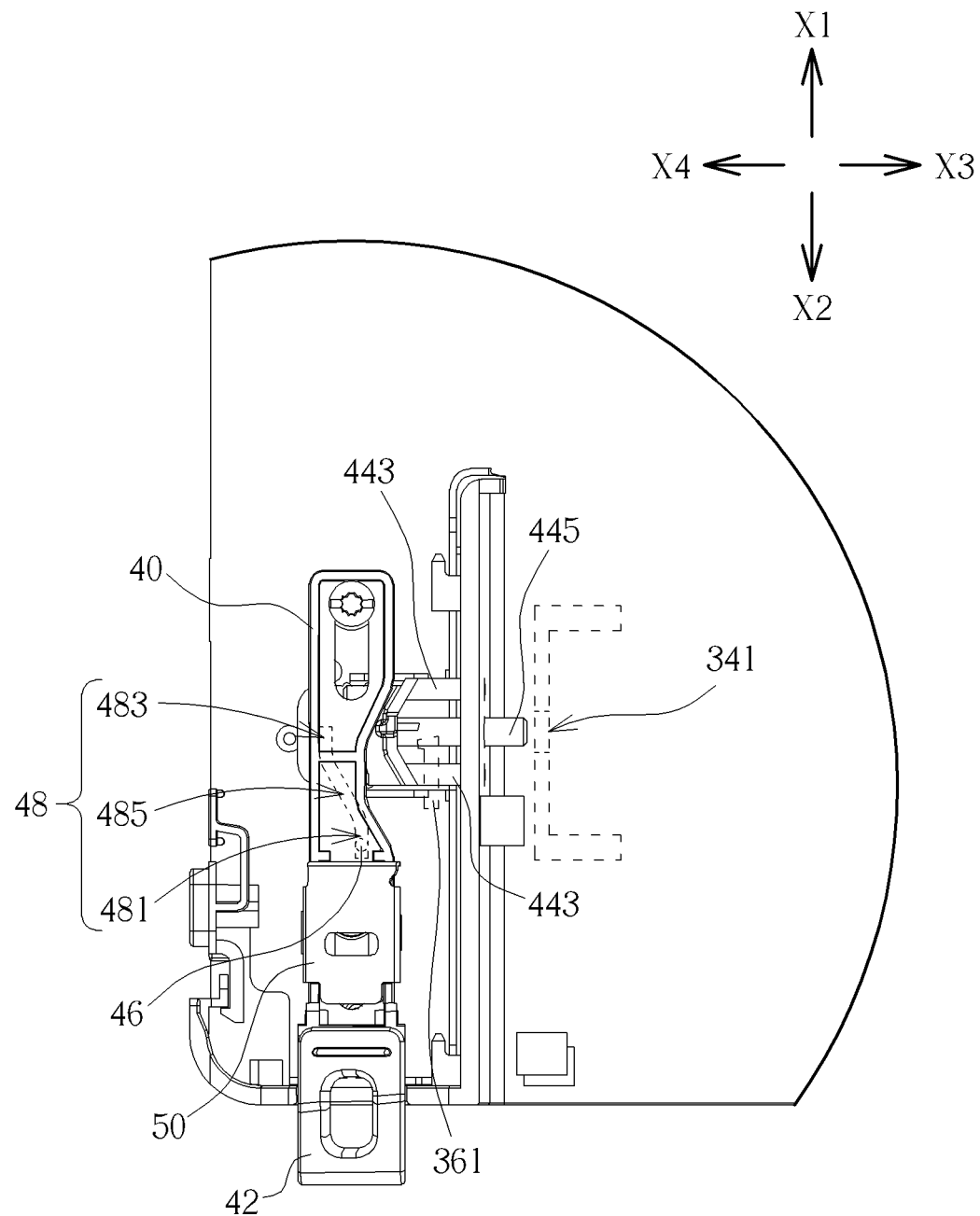
FIG. 7 is a top diagram of the lock mechanism in a release status according to the embodiment of the present invention.
Figure 8:
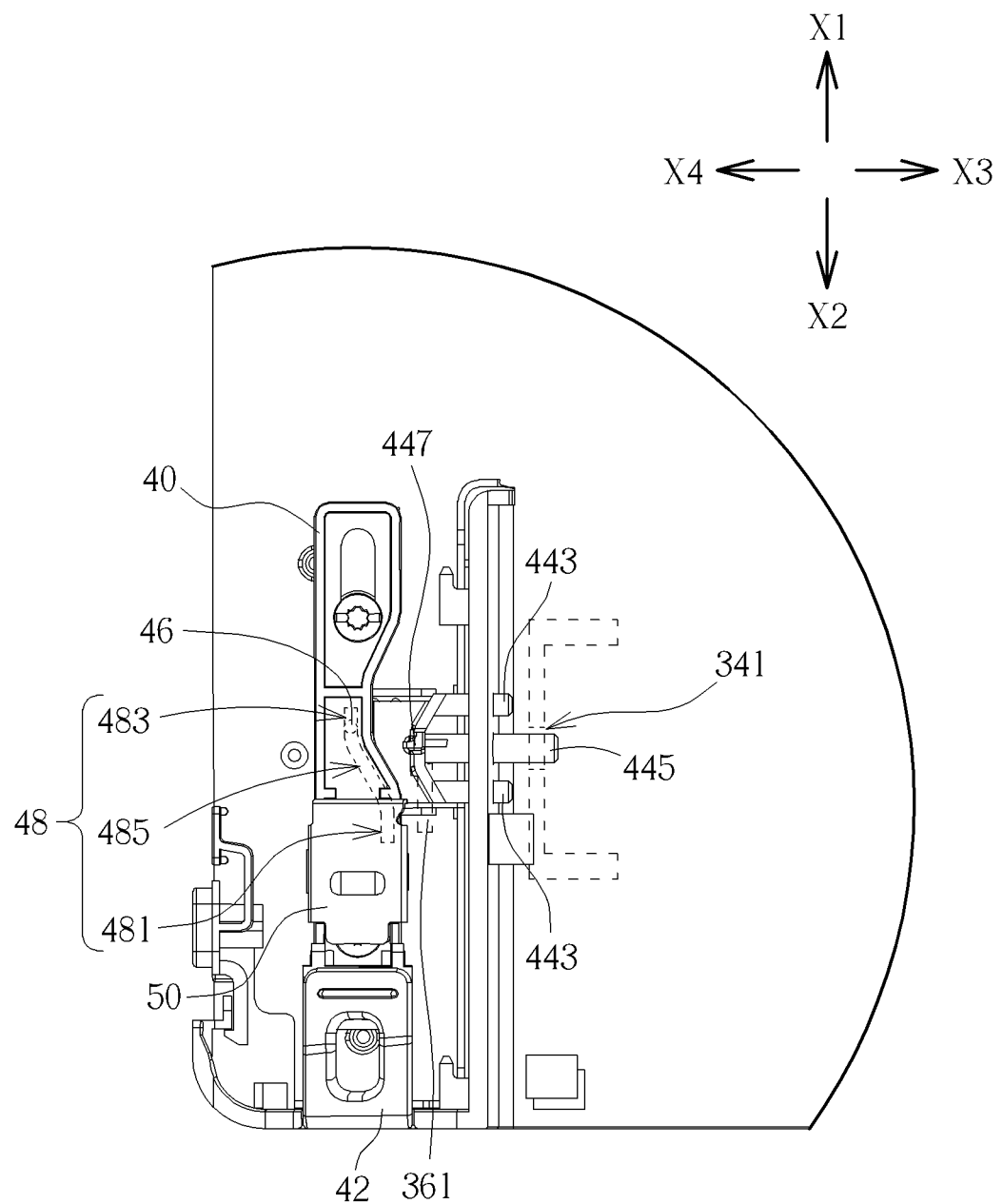
FIG. 8 is a top diagram of the lock mechanism in a locking status according to the embodiment of the present invention.

Please refer to FIG. 7 and FIG. 8. FIG. 7 is a top diagram of the lock mechanism 38 in a release status according to the embodiment of the present invention. FIG. 8 is a top diagram of the lock mechanism 38 in a locking status according to the embodiment of the present invention. As shown in FIG. 7 and FIG. 8, when the push button 42 is pushed to slide the sliding member 40 from a position shown in FIG. 7 to a position shown in FIG. 8 along the first direction X1, the first guiding structure 46, i.e. the guide pin, is slid with the sliding member 40 along the first direction X1. During the first guiding structure 46 sliding along the first direction X1, the first guiding structure 46 moves from the first guiding slot portion 481 to the second guiding slot portion 483 via the third guiding slot portion 485. In the meanwhile, the latch body 441 of the latch member 44 is driven by the first guiding structure 46, i.e. the guide pin. Additionally, the two constraining posts 443 of the latch member 44 are constrained by the through holes 325 and thus can only slide relative to the base 32 along the third direction X3. In such a manner, the latch body 441 can be guided from a release position shown in FIG. 7 to a locking position shown in FIG. 8 along the third direction X3.

When the push button 42 is pushed to slide the sliding member 40 from the position shown in FIG. 8 to the position shown in FIG. 8 along the second direction X2, the first guiding structure 46, i.e. the guide pin, is slid with the sliding member 40 along the second direction X2. During the first guiding structure 46 sliding along the second direction X2, the first guiding structure 46 moves from the second guiding slot portion 483 to the first guiding slot portion 481 via the third guiding slot portion 485. In the meanwhile, the latch body 441 of the latch member 44 is driven by the first guiding structure 46, i.e. the guide pin. Additionally, the two constraining posts 443 of the latch member 44 are constrained by the through holes 325 and thus can only slide relative to the base 32 along the fourth direction X4. In such a manner, the latch body 441 can be guided from the locking position shown in FIG. 8 to the release position shown in FIG. 7 along the fourth direction X4.

Figure 9:
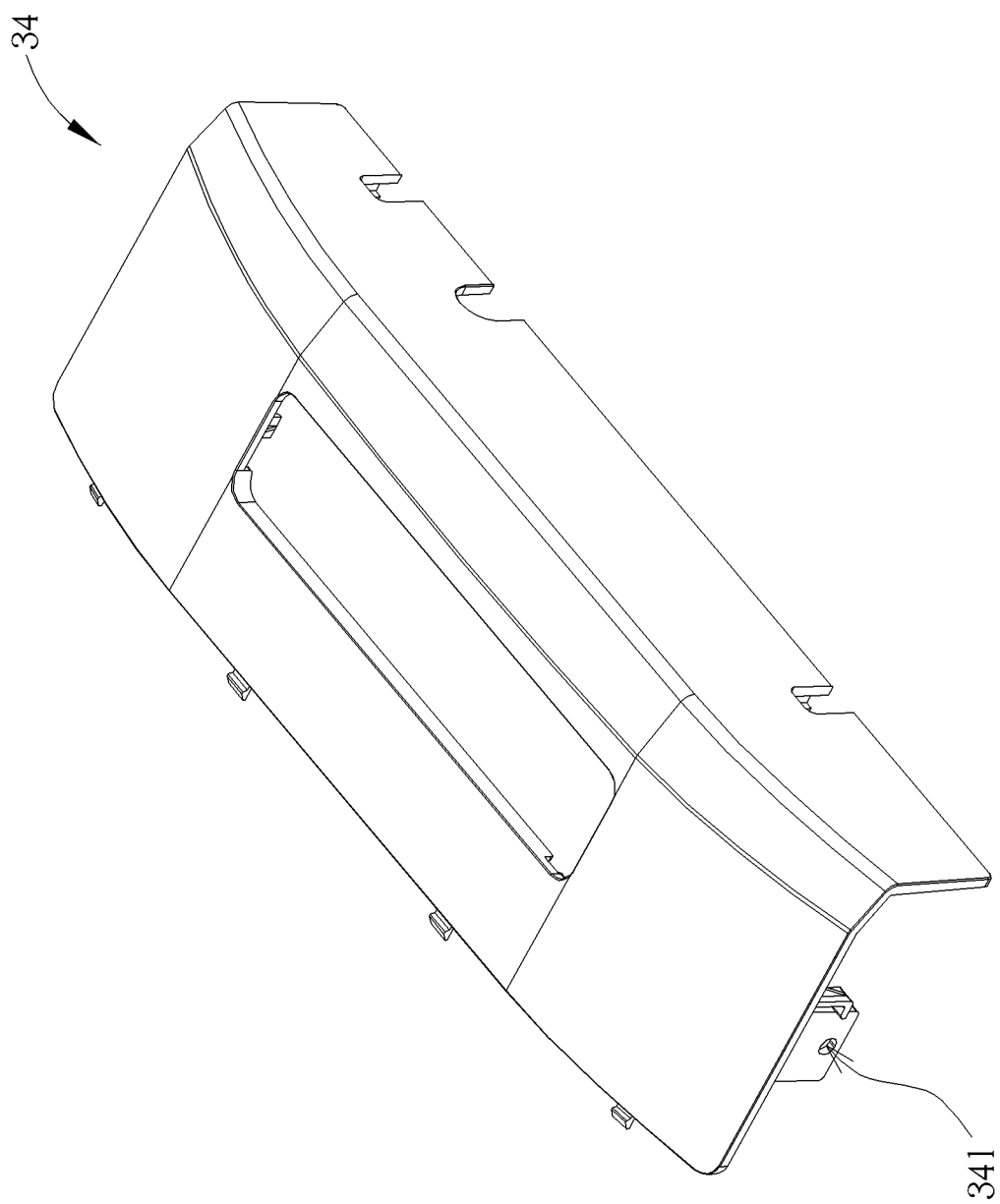
FIG. 9 is a diagram of a first casing according to the embodiment of the present invention.
Figure 10:
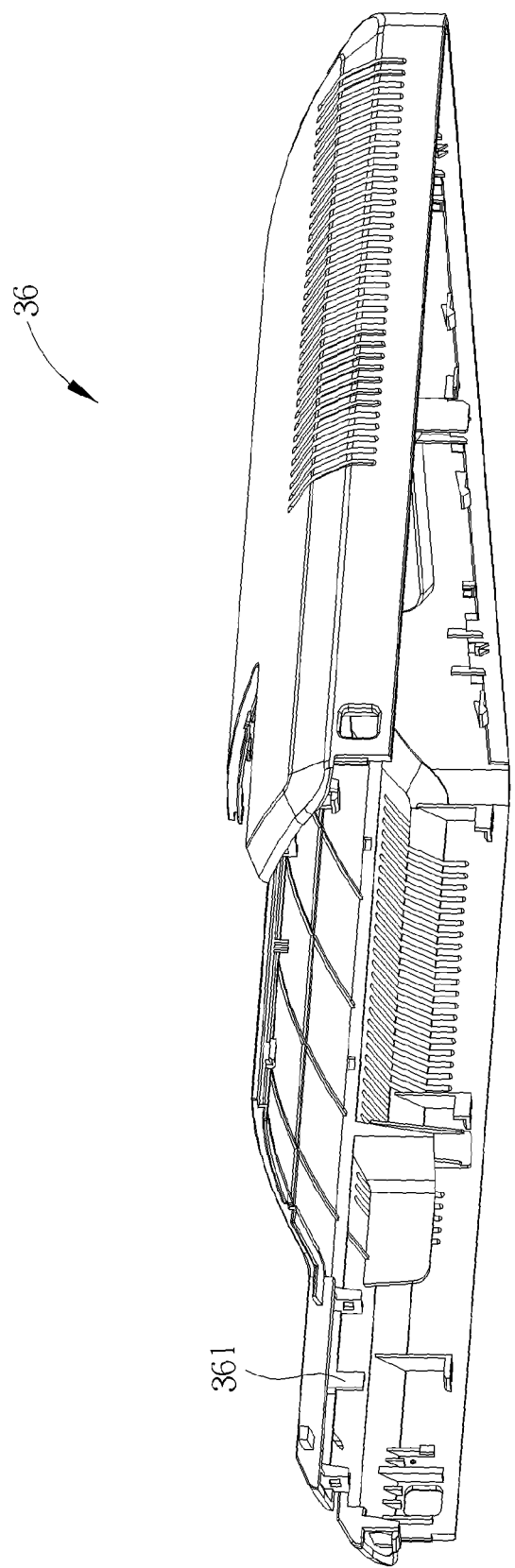
FIG. 10 is a diagram of a second casing in another view according to the embodiment of the present invention.

Please refer to FIG. 6 to FIG. 10. FIG. 9 is a diagram of the first casing 34 according to the embodiment of the present invention. FIG. 10 is a diagram of the second casing 36 in another view according to the embodiment of the present invention. As shown in FIG. 6 to FIG. 10, a wedging slot 341 is formed on the first casing 34, and the second casing 36 includes a stopping structure 361. The latch member 44 further includes a stopping portion 447 disposed on the latch body 441 for cooperating with the stopping structure 361, so as to stop the second casing 36 in the locking position.

When the latch body 441 is guided from the release position shown in FIG. 7 to the locking position shown in FIG. 8 along the third direction X3, the wedging pin 445 of the latch member 44 wedges with the wedging slot 341 on the first casing 34, so as to prevent the first casing 34 from separating from the base 32 along the second direction X2. In such a manner, the first casing 34 can be locked in the locking position shown in FIG. 8 by the latch member 44. In addition, when the latch body 441 is guided from the release position shown in FIG. 7 to the locking position shown in FIG. 8 along the third direction X3, the stopping portion 447 of the latch member 44 abuts against the stopping structure 361 on the second casing 36, so as to prevent the second casing 36 from separating from the base 32 along the first direction X1. In such a manner, the second casing 36 can be locked in the locking position shown in FIG. 8 by the latch member 44.

In summary, the present invention utilizes the wedging pin 445 of the latch member 44 to wedge with the wedging slot 341 on the first casing 34 for preventing the first casing 34 from separating from the base 32 along the second direction X2, so as to fix the first casing 34 on the base 32. Furthermore, the present invention also utilizes the stopping portion 447 of the latch member 44 to abut against the stopping structure 361 of the second casing 36 for preventing the second casing 36 from separating from the base 32 along the first direction X1, so as to fix the second casing 36 on the base 32. In other words, the latch member 44 of the present invention can simultaneously lock the first casing 34 and the second casing 36 on the base 32.

Figure 11:
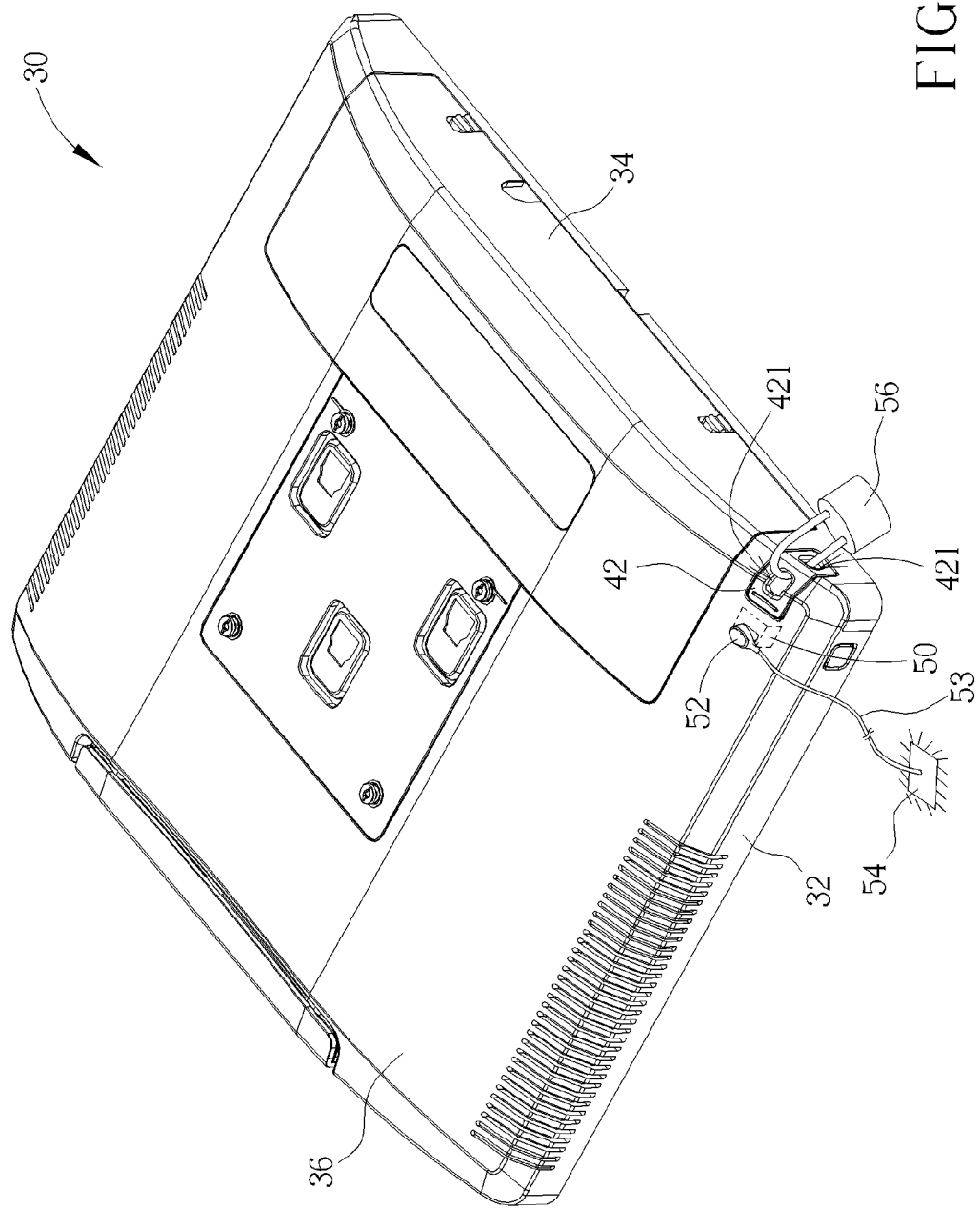
FIG. 11 is a schematic diagram of the electronic device in the locked status according to the embodiment of the present invention.

Please refer to FIG. 4 and FIG. 11. FIG. 11 is a schematic diagram of the electronic device 30 in the locked status according to the embodiment of the present invention. As shown in FIG. 4 to FIG. 11, the lock mechanism 38 further includes a locking member 50 combined and slidable with the sliding member 40. A locking slot 51 is formed on the locking member 50 for cooperating with a locking pin 52. When the lock mechanism 38 is in the locked status shown in FIG. 11, the locking pin 52 can be inserted into the locking slot 51 and locked with the locking member 50. Accordingly, the locking member 50 can lock the sliding member 40 in the locking position. In such a manner, the latch member 44 can be fixed in the locking position for preventing the wedging pin 445 of the latch member 44 from separating from the locking position and further for wedging the wedging pin 445 of the latch member 44 with the wedging slot 341 on the first casing 34 more firmly. Furthermore, when the latch member 44 is fixed in the locking position, it can prevent the stopping portion 447 of the latch member 44 from separating from the locking position as well, such that the stopping portion 447 of the latch member 44 can continuously abut against the stopping structure 361 of the second casing 36. In such a manner, the first casing 34 and the second casing 36 can be fixed on the base 32. In this embodiment, the locking slot 51 can be a Kensington Lock Slot, and the locking pin 52 can be a corresponding Kensington Lock.

In addition, the locking pin 52 of the present invention is further connected to a fixing object 54 by utilizing a cable 53, so as to fix the electronic device 30 onto the fixing object 54, as shown in FIG. 11. In other words, when the electronic device 30 is in the locked status, the electronic device 30 can be connected to the fixing object 54 by the locking pin 52 and the cable 56. In such a manner, the electronic device 30 can be fixed onto the fixing object 54 for preventing the electronic device 30 from moving to other places, so as to achieve theft prevention. In this embodiment, the fixing object 54 can be a ground, a wall, a desk and so on.

Furthermore, the push button 42 of the lock mechanism 38 includes a locking portion 421. When the lock mechanism 38 is in the locked status shown in FIG. 11, the locking portion 421 of the push button 42 can be used for locking with a lock device 56, so as to fix the sliding member 40 in the locking position. Accordingly, the latch member 44 can be fixed in the locking position for preventing the wedging pin 445 of the latch member 44 from separating from the locking position and further for wedging the wedging pin 445 of the latch member 44 with the wedging slot 341 on the first casing 34. Furthermore, when the latch member 44 is fixed in the locking position, it can prevent the stopping portion 447 of the latch member 44 from separating from the locking position as well, such that the stopping portion 447 of the latch member 44 can continuously abut against the stopping structure 361 of the second casing 36. In such a manner, the first casing 34 and the second casing 36 can be fixed on the base 32.

Compared to the prior art, the present invention utilizes a wedging pin of the latch member to wedge with the wedging slot on the first casing for preventing the first casing from separating from the base along the second direction, so as to fix the first casing on the base. Furthermore, the present invention also utilizes the stopping portion of the latch member to abut against the stopping structure of the second casing for preventing the second casing from separating from the base along the first direction, so as to fix the second casing on the base. In other words, the latch member of the present invention can simultaneously lock the first casing and the second casing on the base. In other words, the present invention can only utilize one single lock device to cooperate with a locking member or a locking portion of the push button for fixing the latch member in the locking position, so as to further fix the first casing and the second casing on the base.

In summary, the present invention is capable of simultaneously locking the first casing and the second casing by the single one lock device. Accordingly, it can save costs of the lock device, and the locking operation of the single one lock device can be done by a single operation without an extra operation. As a result, it can reduce complication of the operation and greatly enhance convenience in use.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lock mechanism adapted to an electronic device, the electronic device comprising a base, a first casing and a second casing, the first casing and the second casing being installed on the base, the lock mechanism comprising:
   a sliding member disposed on the base in a slidable manner;
   a push button combined with the sliding member for driving the sliding member to slide relative to the base, wherein the sliding member is capable of sliding relative to the base in a first direction or in a second direction;
   a latch member disposed on the base in a slidable manner;
   a first guiding structure disposed on the sliding member; and
   a second guiding structure disposed on the latch member, inclined plane movement between the second guiding structure and the first guiding structure causing that the sliding member drives the latching member in a third direction to a locking position when the sliding member slides relative to the base in the first direction, and the sliding member drives the latching member in a fourth direction opposite to the third direction to a release position when the sliding member slides relative to the base in the second direction, wherein the first direction, the second direction, the third direction and the fourth direction are linear directions.

2. The lock mechanism of claim 1, wherein the first casing is installed on the base along a first direction, the second casing is installed on the base along a second direction opposite to the first direction, the base comprises a guiding structure, the sliding member comprises a sliding structure, and the guiding structure is for cooperating with the sliding structure, so as to slide the sliding member relative to the base along the first direction or along the second direction.

3. The lock mechanism of claim 2, wherein the guiding structure comprises a first guiding member and a second guiding member, and the sliding structure comprises:
   a first slot structure for cooperating with the first guiding member; and
   a second slot structure for cooperating with the second guiding member, the second slot structure and the first slot structure being cooperatively for constraining the sliding member to slide along the first direction or along the second direction and for preventing the sliding member from rotating about the base when the sliding member slides relative to the base.

4. The lock mechanism of claim 3, wherein at least one through hole is formed on the base, a wedging slot is formed on the first casing, the second casing comprises a stopping structure, and the latch member comprises:
   a latch body whereon the second guiding structure is formed;
   at least one constraining post protruding from the latch body and slidably disposed through the at least one through hole, so as to constrain the latch body to slide relative to the base along the third direction or along the fourth direction;
   a wedging pin protruding from the latch body, the wedging pin wedging with the wedging slot when the latch body slides to the locking position along the third direction, so as to prevent the first casing from separating from the base along the second direction; and
   a stopping portion disposed on the latch body for abutting against the stopping structure when the latch body slides to the locking position along the third direction, so as to prevent the second casing from separating from the base along the first direction.

5. The lock mechanism of claim 4, wherein the first guiding structure is a guide pin, the second guiding structure is a guiding slot and comprises:
   a first guiding slot portion;
   a second guiding slot portion, a distance between the second guiding slot portion and the wedging pin being greater than a distance between the first guiding slot portion and the wedging pin; and
   a third slot portion connected to the first guiding slot portion and the second guiding slot portion, the latch body being guided to the locking position along the third direction when the guide pin moves from the first guiding slot portion to the second guiding slot portion via the third guiding slot portion along the first direction, the latch body being guided to the release position along the fourth direction when the guide pin moves from the second guiding slot portion to the first guiding slot portion via the third guiding slot portion along the second direction.

6. The lock mechanism of claim 3, wherein the first direction or the second direction is substantially perpendicular to the third direction or the fourth direction.

7. The lock mechanism of claim 1, further comprising:
a locking member combined and slidable with the sliding member for locking the sliding member in the locking position.

8. The lock mechanism of claim 1, wherein the push button comprises a locking portion for locking with a lock device.

9. The lock mechanism of claim 1, wherein the sliding member and the push button are integrally formed.

10. An electronic device, comprising:
a base;
a first casing installed on the base;
a second casing installed on the base; and
a lock mechanism, comprising:
  a sliding member disposed on the base in a slidable manner;
  a push button combined with the sliding member for driving the sliding member to slide relative to the base, wherein the sliding member is capable of sliding relative to the base in a first direction or in a second direction;
  a latch member disposed on the base in a slidable manner;
  a first guiding structure disposed on the sliding member; and
  a second guiding structure disposed on the latch member, inclined planed movement between the second guiding structure and the first guiding structure causing that the sliding member drives the latching member in a third direction to a locking position when the sliding member slides relative to the base in the first direction, and the sliding member drives the latching member in a fourth direction opposite to the third direction to a release position when the sliding member slides relative to the base in the second direction, wherein the first direction, the second direction, the third direction and the fourth direction are linear directions.

11. The electronic device of claim 10, wherein the first casing is installed on the base along a first direction, the second casing is installed on the base along a second direction opposite to the first direction, the base comprises a guiding structure, the sliding member comprises a sliding structure, and the guiding structure is for cooperating with the sliding structure, so as to slide the sliding member relative to the base along the first direction or along the second direction.

12. The electronic device of claim 11, wherein the guiding structure comprises a first guiding member and a second guiding member, and the sliding structure comprises:
a first slot structure for cooperating with the first guiding member; and
a second slot structure for cooperating with the second guiding member, the second slot structure and the first slot structure being cooperatively for constraining the sliding member to slide along the first direction or along the second direction and for preventing the sliding member from rotating about the base when the sliding member slides relative to the base.

13. The electronic device of claim 12, wherein at least one through hole is formed on the base, a wedging slot is formed on the first casing, the second casing comprises a stopping structure, and the latch member comprises:
a latch body whereon the second guiding structure is formed;
at least one constraining post protruding from the latch body and slidably disposed through the at least one through hole, so as to constrain the latch body to slide relative to the base along the third direction or along the fourth direction;
a wedging pin protruding from the latch body, the wedging pin wedging with the wedging slot when the latch body slides to the locking position along the third direction, so as to prevent the first casing from separating from the base along the second direction; and
a stopping portion disposed on the latch body for abutting against the stopping structure when the latch body slides to the locking position along the third direction, so as to prevent the second casing from separating from the base along the first direction.

14. The electronic device of claim 13, wherein the first guiding structure is a guide pin, the second guiding structure is a guiding slot and comprises:
a first guiding slot portion;
a second guiding slot portion, a distance between the second guiding slot portion and the wedging pin being greater than a distance between the first guiding slot portion and the wedging pin; and
a third slot portion connected to the first guiding slot portion and the second guiding slot portion, the latch body being guided to the locking position along the third direction when the guide pin moves from the first guiding slot portion to the second guiding slot portion via the third guiding slot portion along the first direction, the latch body being guided to the release position along the fourth direction when the guide pin moves from the second guiding slot portion to the first guiding slot portion via the third guiding slot portion along the second direction.

15. The electronic device of claim 12, wherein the first direction or the second direction is substantially perpendicular to the third direction or the fourth direction.

16. The electronic device of claim 9, further comprising:
a locking member combined and slidable with the sliding member for locking the sliding member in the locking position.

17. The electronic device of claim 9, wherein the push button comprises a locking portion for locking with a lock device.

18. The electronic device of claim 9, wherein the sliding member and the push button are integrally formed.

* * * * *